Nov. 2, 1965 D. R. SORCHYCH 3,215,859
FIELD EFFECT TRANSISTOR GATE
Filed Nov. 20, 1962
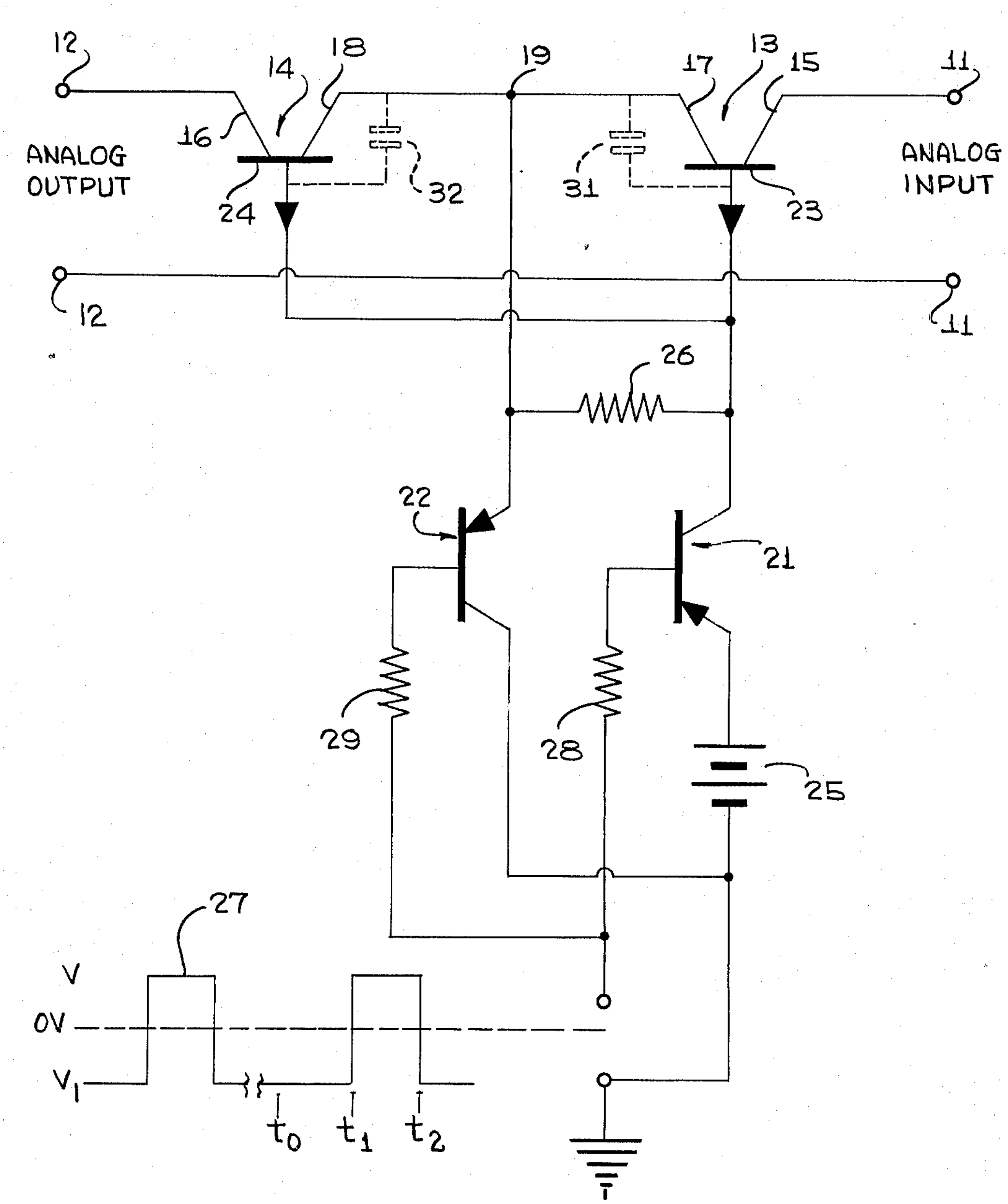
INVENTOR.
DONALD R. SORCHYCH
BY Hurvitz & Rose
ATTORNEYS

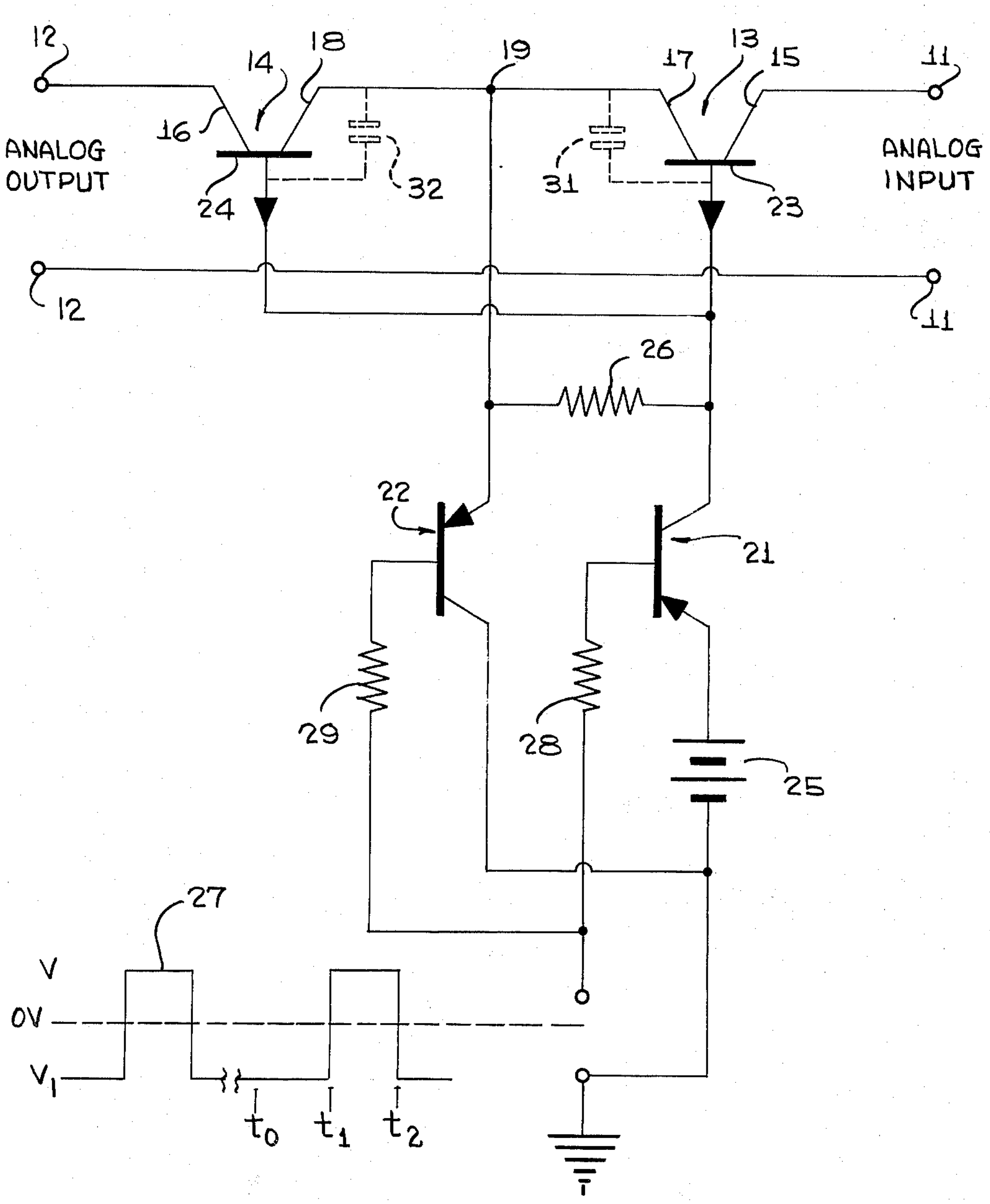
INVENTOR.
DONALD R. SORCHYCH
BY Hurvitz & Rose
ATTORNEYS

United States Patent Office 3,215,859

Patented Nov. 2, 1965

3,215,859

FIELD EFFECT TRANSISTOR GATE

Donald Rudolph Sorchych, Melbourne Beach, Fla., assignor to Radiation Incorporated, Melbourne, Fla., a corporation of Florida Filed Nov. 20, 1962, Ser. No. 238,945
16 Claims. (Cl. 307—88.5)

The present invention relates to gating circuits and more particularly to a gating circuit employing a pair of cascaded field effect transistors which are alternately rendered in low and high impedance states.

The need presently exists for a gating circuit, particularly for analog signals, which is suited to be utilized with existing microelectronic components. The output of such a circuit preferably has a zero voltage offset, i.e. no biasing is introduced at the output terminal. Otherwise, A.C. coupling, e.g. a transformer or capacitor, or a voltage level restorer must be employed for the output signal and the utilization of existing microelectronic techniques is obviated.

Many prior gating circuits with which I am familiar employ a saturable transformer, particularly with floating signals. The time intervals such gates are maintained in open and closed conditions are determined by the size of the transformer core. This leads to inaccuracies in the gating intervals and requires considerably greater volume than can be tolerated in a microminiature circuit. Transformers also have been considered as an optimum gating component in the past because of the great degree of isolation that they are capable of achieving.

The circuit of the present invention incorporates all of the advantages of a transformer and obviates its drawbacks by employing a pair of cascaded field effect transistors, connected between a pair of signal input and output terminals. The field effect transistors are sequentially rendered conductive and non-conductive by a switching circuit including a pair of conventional transistors. One of the latter transistors couples a biasing voltage to the gate electrodes of both field effect transistors to pinch them off and prevent conduction between the input and output terminals. At the same time, the common junction between the source electrodes of the field effect transistors is connected to ground via a low impedance path established through the second conventional transistor. Hence, a charge is built up between the gate and source electrodes of each field effect device. Subsequently, the two conventional transistors are cut-off and a low impedance discharge path is immediately provided through a resistor connected between the conventional transistors. Thereby, the bias on the field effect transistors is completely removed and they are driven to a low impedance state which permits coupling between the input and output terminals.

The gating circuit of the present invention, in addition to achieving the advantages of a transformer circuit while obviating its drawbacks, has low power requirements and is responsive to voltages and current levels available in many standard logic systems. Further, the gate is a true D.C. switch which can be maintained in a conducting state for indefinite periods with no change required in design, only the command pulse need be extended.

It is, accordingly, an object of the present invention to provide a new and improved gating circuit.

Another object of the present invention is to provide a gating circuit particularly adapted to be fabricated from existing microminiature circuit elements.

An additional object of the present invention is to provide a new and improved gating circuit having zero offset voltage at its output terminals.

A further object of the present invention is to provide a gating circuit employing a pair of cascaded field effect transistors which are sequentially and definitely driven into complete "pinch off" and conduction.

The above and still further objects, features and advantages of the present invention will become apparent upon consideration of the following detailed description of one specific embodiment thereof, especially when taken in conjunction with the accompanying drawings, wherein:

The single figure is a schematic circuit diagram of a preferred embodiment of the present invention.

Reference is now made to the single figure of the drawing wherein the reference numerals 11 and 12 represent a pair of analog input and output terminals, respectively. Connected between terminals 11 and 12 is a pair of cascaded electrostatic field effect transistors 13 and 14. The drain terminals 15 and 16, ohmically connected to the P-type semiconductor wafer of field effect transistors 13 and 14, are connected directly to input and output terminals 11 and 12, respectively, while the ohmic source electrodes 17 and 18 on the same respective wafers are connected together at point 19.

To control the conduction of current from the analog input signal at terminals 11 to the load connected between terminals 12, an electronic switching circuit including PNP transistors 21 and 22 is provided. The collector of transistor 21 is connected in parallel to the gate electrodes 23 and 24 of field effect transistors 13 and 14. As it well known, each gate electrode is an N-type semiconductor layer mounted on the P type wafer which forms the field effect transistor body upon which are mounted the ohmic drain and source electrodes. Collector-emitter biasing for transistor 21 is established by battery 25, having its positive and negative terminals connected to the transistor emitter and ground, respectively. The emitter and collector of transistor 22 are connected to point 19 and ground, respectively. Connected between the collector and emitter of transistors 21 and 22 is resistor 26.

To control the conduction of PNP transistors 21 and 22, hence the impedance of field effect transistors 14 and 15, a periodic rectangular wave 27 having positive and negative voltage components is coupled via current limiting resistors 28 and 29 to the transistor bases. At time $t_0$, when the voltage of waveform 27 is negative and transistors 21 and 22 are both forwardly biased to saturation, the positive voltage of source 25 is coupled to gate terminals 23 and 24 via transistor 21 while ground potential is coupled to source terminals 17 and 18 via transistor 22. Due to the resulting positive bias of gate electrodes 23 and 24 relative to source electrodes 17 and 18, conduction of field effect transistors 13 and 14 is "pinched" off. Hence, conduction through transistors 13 and 14 in response to the analog input at terminal 11 is prevented. Complete non-conduction between input and output terminals 11 and 12 is established since transistors 13 and 14 respectively isolate terminals 11 and 12, from shunt switch 22.

Due to the distributed interelectrode capacities 31 and 32 between the gate and source electrodes of transistors 13 and 14, a positive charge is built up on both of the gate electrodes 23 and 24 when the field effect transistors are pinched off.

At time $t_1$ when the voltage of waveform 27 goes positive, PNP transistors 21 and 22 are back biased to cutoff. Hence, the positive voltage of source 25 is decoupled from gate electrodes 23 and 24, resulting in discharge of capacitors 31 and 32 through resistor 26. Complete discharge of capacitors 31 and 32 occurs through the low impedance path provided by resistor 26 so that no voltage difference exists between the gate and source terminals. The impedances of field effect transistors 13 and 14 then become virtually negligible and the analog input passes unattenuated between terminals 11 and 12. Without the presence of a low impedance path for the charge established across capacitors 31 and 32, switching of the field effect transistors is not precise and they frequently will not be driven to their lowest impedance states.

At time $t_2$, when wave 27 again goes negative, transistors 21 and 22 are driven to saturation and field effect transistors 13 and 14 are pinched off. This operation is repeated for each cycle of wave 27 so that a chopped replica of the input at terminals 11 is derived at output terminals 12. By employing field effect transistors, no biasing offset between the input and output is obtained and the need for voltage level restorers is obviated.

While I have described and illustrated one specific embodiment of my invention, it will be clear that variations of the details of construction which are specifically illustrated and described may be resorted to without departing from the true spirit and scope of the invention as defined in the appended claims.

What is claimed is:

1. A gating circuit for an input voltage comprising a pair of cascaded field effect transistors, each of said transistors having a pair of ohmic electrodes and a gate electrode, one ohmic electrode of one of said transistors being responsive to said voltage, an output voltage being derived at one ohmic electrode of the other transistor, the other ohmic electrodes of said transistors having a common connection, means for coupling a control signal between both said gate electrodes and said common connection to render said transistors in a high impedance state, whereby charges are established between both the gate electrodes and said common connection, and means for subsequently establishing a low impedance discharge path for the established charges and for rendering both said transistors in a low impedance state.

2. A gating circuit for an input voltage comprising a pair of cascaded field effect transistors, each of said transistors having a pair of ohmic electrodes and a gate electrode, one ohmic electrode of one of said transistors being responsive to said voltage, an output voltage being derived at one ohmic electrode of the other transistor, the other ohmic electrodes having a common connection, means for rendering said transistors in a high impedance state whereby charges are established between both said gate electrodes and said connection, and means for subsequently establishing a low impedance discharge path for the established charges and for rendering said transistors in a low impedance state.

3. A gating circuit for an input voltage comprising a pair of cascaded field effect transistors, each of said transistors having a pair of ohmic electrodes and a gate electrode, one ohmic electrode of one of said transistors being responsive to said voltage, an output voltage being derived at one ohmic electrode of the other transistor, the other ohmic electrodes having a common connection, switching means for coupling a control voltage to both the gate electrodes to render said transistors in a high impedance state, whereby charges are established between said gate electrodes and said connection, said switch means including means for subsequently removing said charges via a low impedance discharge path and reducing the control voltage applied to said gate electrodes to render said transistors in a low impedance state.

4. A gating circuit for an input voltage comprising a pair of cascaded field effect transistors, each of said transistors having a pair of ohmic electrodes and a gate electrode, one ohmic electrode of one of said transistors being responsive to said voltage, an output voltage being derived at one ohmic electrode of the other transistor, the other ohmic electrodes having a common connection, a second pair of transistors, the transistors of said second pair having emitter, collector, and base electrodes, a biasing source connected to said gate electrodes via the emitter-collector path of one transistor of said second pair, said common connection being connected to a point of reference potential via the emitter-collector path of the other transistor of said second pair, said biasing source being of sufficient amplitude to render said field effect transistors in a high impedance state, means for applying a signal to both said bases to render said second pair of transistors simultaneously and alternately conducting and non-conducting, whereby charges are built up between the gate electrodes and said connection when said second pair of transistors is conducting, and a low impedance discharge path for said charges being included between the gate electrodes and said common connection when said second pair of transistors is non-conducting.

5. A gating circuit for an input voltage comprising a pair of cascaded field effect transistors, each of said transistors having a pair of ohmic electrodes and a gate electrode, one ohmic electrode of one of said transistors being responsive to said voltage, an output voltage being derived at one ohmic electrode of the other transistor, the other ohmic electrodes having a common connection, a pair of switches, a biasing source connected to said gate electrodes via one of said switches, said source being of sufficient amplitude to render said field effect transistors in a high impedance state, said common connection being connected to a point of reference potential via the other switch, means for rendering both said switches alternately conducting and non-conducting, whereby charges are built up between the gate electrodes and said connection when said switches are conducting, and a low impedance discharge path for said charges being included between the gate electrodes and said common connection when said switches are non-conducting.

6. A gating circuit for coupling an input voltage source to a load comprising a pair of cascaded voltage controlled, variable impedances, said impedances having a pair of first electrodes and a control electrode, one of the first electrodes of one of said impedances being responsive to said input voltage source, one of the first electrodes of the other of said impedances being coupled to said load, the other first electrodes having a common connection, said cascaded voltage controlled, variable impedances being connected in a D.C. circuit having zero potential offset between said input voltage source and said load, means for coupling a control voltage to both said control electrodes to render said impedances in a high impedance state, whereby charges are established between both the control electrodes and said common connection, and means for subsequently establishing a low impedance discharge path for the established charges and for rendering both said impedances in a low impedance state.

7. The circuit of claim 6 wherein said impedances include a semiconductor wafer, and said first electrodes are ohmic connections to said wafer.

8. A gating circuit for selectively coupling an input voltage source to an output load comprising a field effect transistor having a pair of ohmically connected electrodes and a gate electrode, means connecting said ohmically connected electrodes in a D.C. circuit having zero D.C. potential offset between said source and said load, a source of biasing potential connected between one of said ohmically connected electrodes and said gate electrode, said biasing potential being of sufficient amplitude and of such polarity to pinch off conduction between said ohmically connected electrodes, whereby a charge is built up between one of said ohmically connected electrodes and said gate electrode while conduction between said ohmically connected electrodes is pinched off, and switching means for selectively decoupling said biasing potential from said gate electrode while providing a low impedance discharge path for said charge.

9. The circuit of claim 8 wherein said switching means comprises first and second transistors having first and second emitter collector paths and first and second base electrodes, respectively, means connecting said first emitter collector path between said bias potential and said gate electrode, means connecting said second emitter collector path from said one ohmically connected electrode to a reference potential, means for simultaneously applying gating pulses to both said base electrodes to selectively establish low impedances for both said collector emitter paths, and means connected between said one ohmically connected electrode and said gate electrode to provide said low impedance discharge path subsequent to said gating pulses being supplied to said base electrodes.

10. A gating circuit selectively coupling an input voltage source to a load comprising a pair of cascaded field effect transistors, each of said transistors having a pair of ohmic electrodes and a gate electrode, one ohmic electrode of one of said transistors being connected to said voltage source, one ohmic electrode of the other transistor being connected to said load, the other ohmic electrodes having a common connection, switching means for simultaneously coupling a control voltage to both said gate electrodes to render said transistors in a high impedance state, whereby charges are established between said gate electrodes and said common connection, said switching means including means for simultaneously removing said charges by a low impedance discharge path and changing the control voltage amplitude applied to said gate electrodes to render said transistors in a low impedance state.

11. In a gating circuit for selectively coupling an input voltage source to a load comprising a field effect transistor having a pair of ohmic electrodes and a gate electrode, means connecting said ohmic electrodes in a D.C. circuit having zero D.C. potential offset between said source and said load, a transistor having a base electrode and an emitter-collector path impedance controlled by the voltage applied to its base electrode, said emitter-collector path connecting one of said ohmic electrodes in a D.C. circuit to ground potential, means for applying a bi-level voltage between said gate electrode and said one ohmic electrode, the first of said levels being of sufficient amplitude to pinch off conduction between said ohmic electrodes and to establish a charge on the inter-electrode capacity between said gate electrode and said one ohmic electrode, the other of said levels being of sufficient amplitude to provide a low impedance path between said ohmic electrodes, and means synchronized with transitions of said bi-level voltage for supplying a gating signal to said base electrode, said gating signal biasing said base electrode so that said collector emitter impedance is relatively low when said first level is applied to said gate electrode and is relatively large when said other level is applied to said gate electrode, and means connecting said gate electrode with said one ohmic electrode for discharging said charge after transition of said voltage from said first to said other level.

12. The circuit of claim 11 wherein the emitter and collector of said transistor having an emitter collector path are connected to said one ohmic electrode and ground, respectively.

13. In a gating circuit for selectively coupling an input voltage source to a load comprising a pair of cascaded field effect transistors, each of said transistors having a pair of ohmic electrodes and a gate electrode, means connecting said ohmic electrodes in a D.C. circuit having zero D.C. potential offset between said source and said load, one of said ohmic electrodes of one transistor being connected to said source and one ohmic electrode of the other of said field effect transistors being connected to said load, the other ohmic electrodes of said field effect transistors being connected to a common point, a transistor having a base electrode and an emitter collector path impedance controlled by voltage applied to its base electrode, a D.C. circuit including said emitter collector path connecting said common point to ground potential, means for applying bi-level voltages between said gate electrodes and said common connection, the first of said levels being of sufficient amplitude to pinch off conduction between said ohmic electrodes of both said field effect transistors and to establish charges on the inter-electrode capacities between said gate electrodes and said common point, the other of said levels being of sufficient amplitude to provide low impedance paths between said ohmic electrodes of both said field effect transistors, and means synchronized with transitions of said bi-level voltage for applying a gating signal to said base electrode, said gating signal biasing said base electrode so that said collector emitter impedance is relatively low when said first level is applied to said gate electrodes and is relatively large when said other level is applied to said gate electrodes, and means connecting said gate electrodes with said common point for discharging said charge after transitions of said voltage from said first level to said other level.

14. A gating circuit for selectively coupling an input voltage source to a load comprising a field effect transistor having a pair of ohmic electrodes and a gate electrode, means connecting said ohmic electrodes in a circuit between said source and said load, a source of biasing potential connected between one of said ohmic electrodes and said gate electrode, said biasing potential being of sufficient amplitude and of such polarity to pinch off conduction between said ohmic electrodes, whereby charge is built up between one of said ohmic electrodes and said gate electrode while conduction between said ohmic electrodes is pinched off, and switching means for selectively decoupling said biasing potential from said gate electrode while providing a low impedance discharge path for said charge.

15. A gating circuit for selectively coupling an input voltage source to a load comprising a field effect transistor having a pair of ohmic electrodes and a gate electrode, means connecting said ohmic electrodes in circuit between said source and said load, a transistor having a base electrode and an emiter collector path impedance controlled by voltage applied to its base electrode, said emitter collector path connecting one of said ohmic electrodes in a D.C. circuit to ground potential, means for selectively applying a bi-level voltage between said gate electrode and said one of said ohmic electrodes, the first of said levels being of sufficient amplitude to pinch off conduction between said ohmic electrodes and to establish a charge on the interelectrode capacity between said gate electrode and said one ohmic electrode, the other of said levels being of sufficient amplitude to provide a low impedance path between said ohmic electrodes, and means synchronized with transitions of said bi-level voltage for supplying a gating signal to said base electrode, said gating signal biasing said base electrode so that said collector emitter impedance is relatively low when said first level is applied to said gate electrode and is relatively large when said other level is applied to said gate electrode, and means for connecting said gate electrode with said one ohmic electrode for discharging said charge after transitions of said voltage from said first level to said other level.

16. A gating circuit for selectively coupling an input voltage source to a load comprising a pair of cascaded field effect transistors, each having a pair of ohmic electrodes and a gate electrode, means connecting said ohmic electrodes in a first D.C. circuit having zero potential D.C. offset between said source and said load, one ohmic electrode of one of said field effect transistors being connected with said source, one ohmic electrode of the other of said field effect transistors being connected with said load, the other ohmic electrodes of said field effect transistors being connected to a common point, a transistor having a base electrode and an emitter-collector path impedance controlled by voltage applied to its base electrode, said emitter collector path connecting said common point in a second D.C. circuit to ground potential, said second D.C. circuit providing the only D.C. connection to ground for any of said ohmic electrodes, means for selectively applying a bi-level voltage between said gate electrodes and said common point, the first of said levels being of sufficient amplitude to pinch off conduction between said ohmic electrodes and to establish charges on the interelectrode capacities between said gate electrodes and said common point, the other of said levels being of sufficient amplitude to provide a low impedance path between said ohmic electrodes, means synchronized with transistions of said bi-level voltage for applying a gating signal to said base electrodes, said gating signal biasing said base electrode so that said collector emitter impedance is relatively low when said first level is applied to said gate electrodes and relatively large when said other level is applied to said gate electrodes, and means for connecting said gate electrodes with said common point for dissipating said charges after transitions of said voltage from said first level to said other level.

References Cited by the Examiner

UNITED STATES PATENTS

| | | | |
|---|---|---|---|
| 2,980,809 | 4/61 | Teszner | 307—88.5 |
| 3,069,567 | 12/62 | Lewis | 307—88.5 |

ARTHUR GAUSS, *Primary Examiner.*